(12) United States Patent
Syllaios et al.

(10) Patent No.: US 6,897,469 B2
(45) Date of Patent: May 24, 2005

(54) SUB-WAVELENGTH STRUCTURES FOR REDUCTION OF REFLECTIVE PROPERTIES

(76) Inventors: Athanasios J. Syllaios, 12 Bunker Hill, Richardson, TX (US) 75080; Roland W. Gooch, 6936 Sedgwick Dr., Dallas, TX (US) 75231; Thomas R. Schimert, 911 Slippery Elm, Ovilla, TX (US) 75154; Edward G. Meissner, 2033 W. McDermott, Suite 320, PMB 276, Richardson, Dallas County, TX (US) 75080

( * ) Notice: Subject to any disclaimer, the term of this patent is extended or adjusted under 35 U.S.C. 154(b) by 76 days.

(21) Appl. No.: 10/428,745

(22) Filed: May 2, 2003

(65) Prior Publication Data

US 2004/0219704 A1 Nov. 4, 2004

(51) Int. Cl.[7] .......................... H01L 29/06; H01L 23/12
(52) U.S. Cl. .......................... 257/10; 257/680; 257/704
(58) Field of Search ............................. 438/48; 257/10, 257/678, 680, 704

(56) References Cited

U.S. PATENT DOCUMENTS

| | | | |
|---|---|---|---|
| 6,014,251 A | 1/2000 | Rosenberg et al. | 359/350 |
| 6,195,478 B1 | 2/2001 | Fouquet | 385/17 |
| 6,363,183 B1 | 3/2002 | Koh | 385/19 |

FOREIGN PATENT DOCUMENTS

| | | | | |
|---|---|---|---|---|
| EP | 000951069 A1 | * | 4/1999 | H01L/21/30 |
| WO | WO99/50905 | * | 10/1999 | H01L/23/10 |
| WO | WO 01/56921 A2 | | 8/2001 | B81B/7/00 |

OTHER PUBLICATIONS

PCT Notification of Transmittal of the International Search Report and the Written Opinion of the International Searching Authority, or the Declaration mailed Sep. 1, 2004, re PCT/US 2004/012088 filed Apr. 19, 2004 (12 pages).

Nikolajeff, et al., *Fabrication and Simulation of Diffractive Optical Elements with Superimposed Antireflection Sub-wavelength Gratings*, Applied Optics, vol. 39, No. 26, pp. 4842–4846, © 2000 Optical Society of America, Sep. 10, 2000.

Deng, et al., *Fabrication and Properties of Visible–Light Subwavelength Amorphous Silicon Transmission Gratings*, J. Vac. Sci. Technol. B 13(6), pp. 2879–2882, © 1995 American Vacuum Society, Nov./Dec. 1995.

* cited by examiner

Primary Examiner—David S. Blum
(74) Attorney, Agent, or Firm—O'Keefe, Egan & Peterman, LLP

(57) ABSTRACT

A method for manufacturing optically-transparent lids includes etching sub-wavelength structures on a surface of a lid wafer. The structures may be arrayed in a hexagonally closed-packed pattern.

7 Claims, 3 Drawing Sheets

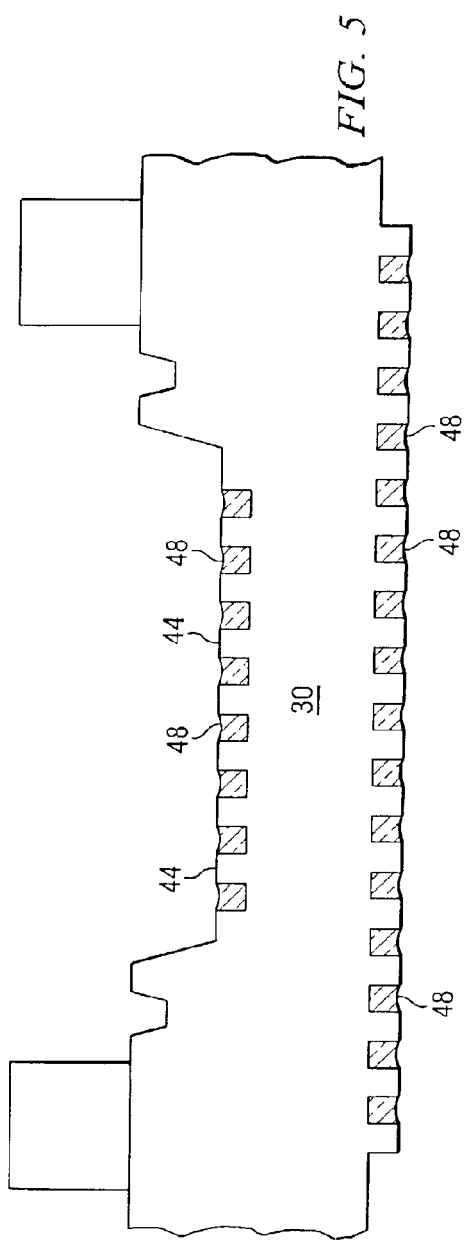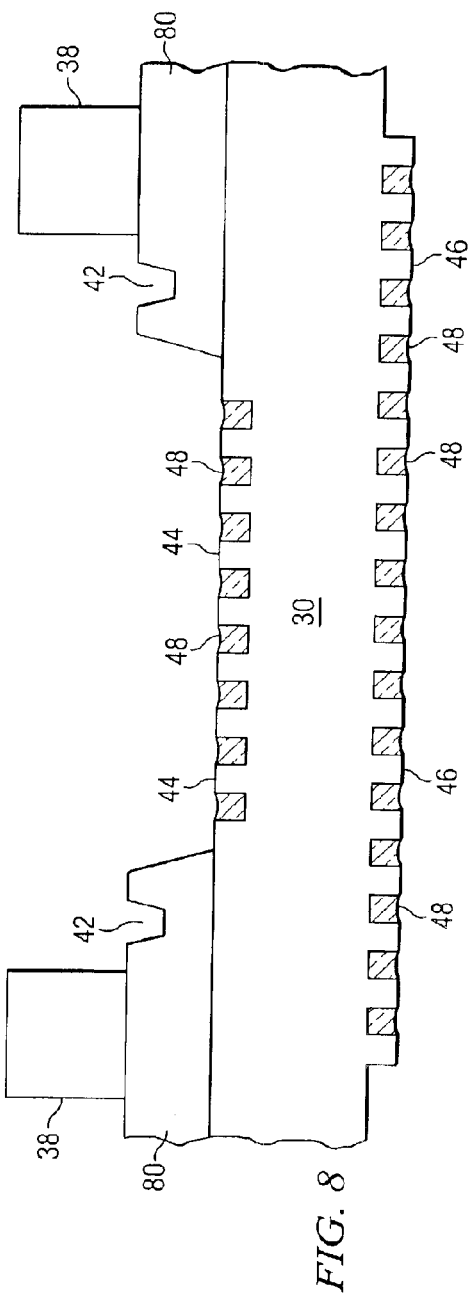

SUB-WAVELENGTH STRUCTURES FOR REDUCTION OF REFLECTIVE PROPERTIES

TECHNICAL FIELD OF THE INVENTION

This invention relates to integrated circuit fabrication, and more particularly, to a system and method for circuit component lids etched with sub-wavelength structures.

BACKGROUND OF THE INVENTION

Microelectromechanical systems (MEMS) are integrated micro devices or systems combining electrical and mechanical components. Some MEMS devices may be fabricated using standard integrated circuit batch processing techniques and have a variety of applications including sensing controlling and actuating on a micro scale. MEMS devices may function individually or in arrays to generate effects on a macro scale.

Certain MEMS devices require a vacuum environment in order to obtain maximum performance. The vacuum package also provides protection in an optimal operating environment for the MEMS device. Examples of these MEMS devices are infrared MEMS such as bolometers. In addition to the necessity of a vacuum or otherwise controlled environment for an infrared bolometer, infrared MEMS devices may require an optically-transparent cover, or lid structure. These device wafer lids are often coated with an anti-reflective coating to reduce the reflective properties and increase the optical transmission properties of the device wafer lid. Typically, the anti-reflective coating is patterned with a liftoff method that requires a thick photoresist, which is hard to remove after the anti-reflective coating is deposited on the device wafer lid. This is due primarily to the extremely high temperatures at which the anti-reflective coating must be deposited on the device wafer lid.

SUMMARY OF THE INVENTION

Among other things, the present invention addresses the problem of the difficulty in depositing an anti-reflective coating on a device wafer lid. According to various embodiments of the present invention, an improved method for increasing the optical transmission characteristics of a device wafer lid is provided, which substantially reduces the disadvantages and problems associated with previously disclosed methods of MEMS device manufacture. According to one embodiment of the invention, there is provided a method for etching sub-wavelength structures on one or both surfaces of a device wafer lid prior to mating a lid wafer with a device wafer.

Various embodiments of the present invention provide various advantages over traditional lid manufacturing methods. It should be noted that any given embodiment of the present invention may provide some, all, or none of these advantages. For example, sub-wavelength structures may be etched onto the surface of a device wafer lid simultaneously with the sealing surfaces, lid cavities, solder excess uptake trenches, and any other structure required to be etched onto the surface of the device wafer lid. Creating the sub-wavelength structure on the device wafer lid prior to the separation of the individual vacuum packaged MEMS devices also saves time and resources. Additionally, etching sub-wavelength structures to increase the optical transmission properties of a device wafer lid obviates the need for the difficult process of applying an anti-reflective coating on the device wafer lid. Other advantages may be readily ascertainable by those of ordinary skill in the art.

BRIEF DESCRIPTION OF THE DRAWINGS

For a more complete understanding of the present invention and the advantages thereof, reference is now made to the following description taken in conjunction with the accompanying drawings:

FIG. 5 is a partial cross-sectional view of the lid wafer illustrated by FIG. 4;

FIG. 8 is a partial cross-sectional view of a window wafer bonded to a lid wafer in accordance with an embodiment of the present invention.

DETAILED DESCRIPTION OF THE DRAWINGS

Infrared microelectromechanical systems (MEMS) devices may require a vacuum, or other suitably manipulated environment, to obtain maximum performance. For example, infrared micro bolometers require an operating pressure of less than 10 millitorr to minimize thermal transfer from the detector elements to the substrate and packaging walls. Additionally, infrared micro bolometers require an optically-transparent cover. Often, an anti-reflective coating is placed on a device wafer lid to increase the optical transmission properties of the lid. Traditional anti-reflective coatings are generally patterned with a liftoff method that requires a thick photoresist. This photoresist is hard to remove after the high temperature deposition of the anti-reflective coating. One solution to the difficulty in applying the anti-reflective coating on a wafer lid is to create geometric features on the wafer lid that reduce the index of refraction.

Among other things, various embodiments of the present invention allow for an anti-reflective surface to be etched on either surface of a device wafer lid, or both, to decrease production costs for optically transparent device wafer lids.

Figure 1:
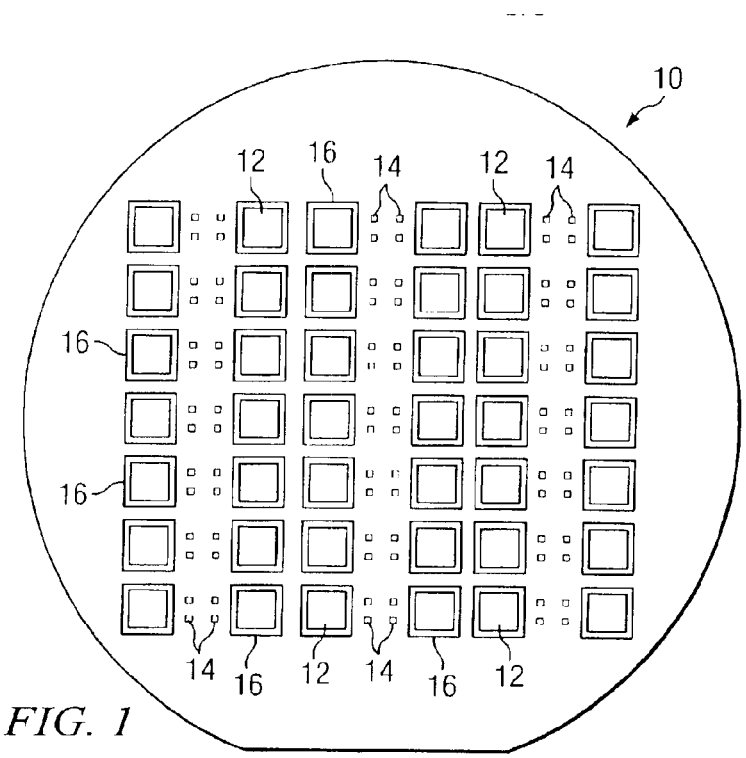
FIG. 1 is a top view of a device wafer in accordance with an embodiment of the present invention.

Referring to FIG. 1, silicon device wafer 10 is a standard substrate used for fabrication of integrated circuit devices, MEMS devices, or similar devices. However, any suitable substrate material may be used. For example, a substrate material with integrated circuit readout devices embedded therein may be used as the device wafer 10. Silicon device wafers usually have many MEMS devices 12 formed thereon using traditional methods of integrated circuit fabrication. Although the embodiments disclosed herein discuss integrated circuit fabrication in terms of vacuum packaging for infrared MEMS devices, the embodiments may be used to provide vacuum packaging of any integrated circuit device, or similar device, formed on a substrate material and contained within a vacuum package. Additionally, the embodiments disclosed herein may be used in any vacuum or non-vacuum packaging of integrated circuit devices.

Each MEMS device 12 preferably has one or more associated bonding pads 14 which provide electrical connections to the MEMS device 12. As indicated in FIG. 1, each MEMS device 12 has two associated bonding pads 14. These bonding pads 14 are preferably disposed only on one side of the MEMS device 12, but in any particular embodiment, bonding pads 14 may be disposed on any side, one side, or multiple sides of MEMS device 12. In addition to device wafer 10, MEMS devices 12, and bonding pads 14, FIG. 1 also depicts sealing surface 16, which defines the vacuum package around a MEMS device 12. Although the present embodiment discusses one MEMS device enclosed in each vacuum package, it is readily understood that multiple MEMS devices may be enclosed within a vacuum package defined by sealing surface 16.

Figure 2:
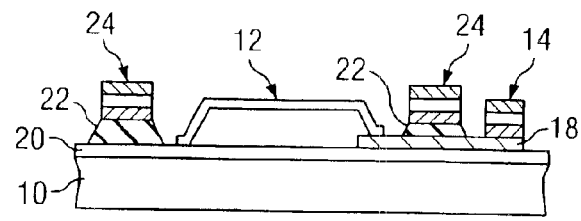
FIG. 2 is a cross section of a single MEMS device according to an embodiment of the present invention.

Referring now to FIG. 2, a single MEMS device 12 is illustrated to more completely show the layout on device wafer 10. A lead 18 connects each bonding pad 14 to MEMS device 12. A space is left between MEMS device 12 and bonding pad 14 to form the device sealing surface 16. Note that lead 18 runs beneath fabrication layers to be built within device sealing surface 16. Because the device sealing surface 16 defines the area of the device wafer 10 within which a vacuum package will be formed, leads 18 form electrical connections to bonding pads 14 without affecting the vacuums' seal existing around MEMS device 12.

Device sealing surface 16 is formed on device wafer 10 such that a sealing layer 22 and bonding adhesion surface 24 may be formed thereon. Sealing layer 22 may be comprised of any suitable material having dielectric properties. Sealing layer 22 serves as a platform upon which bonding adhesion surface 24 may be deposited. Preferably, sealing layer 22 is composed of silicon nitride, although any suitable dielectric may be used. Sealing layer 22 provides electrical isolation for leads 18. A bonding adhesion surface 24 is fabricated on sealing layer 22 and may be fabricated using any combination of metal, metal alloy or other material that is suitable for bonding device wafer 10 and lid wafer 30 together. In one embodiment, bonding adhesion surface 24 comprises a first layer of titanium, a second layer of platinum, and a third layer of gold. However, there are many suitable materials or combinations of materials available for use in fabricating bonding adhesion surface 24. Bonding adhesion surface 24 may be deposited at the same time bonding pads 14 are deposited on device wafer 10. Device sealing surface 16 may utilize a heat-activated solder, a compression seal, such as an indium compression seal, or any other suitable sealing surface material.

Figure 3:
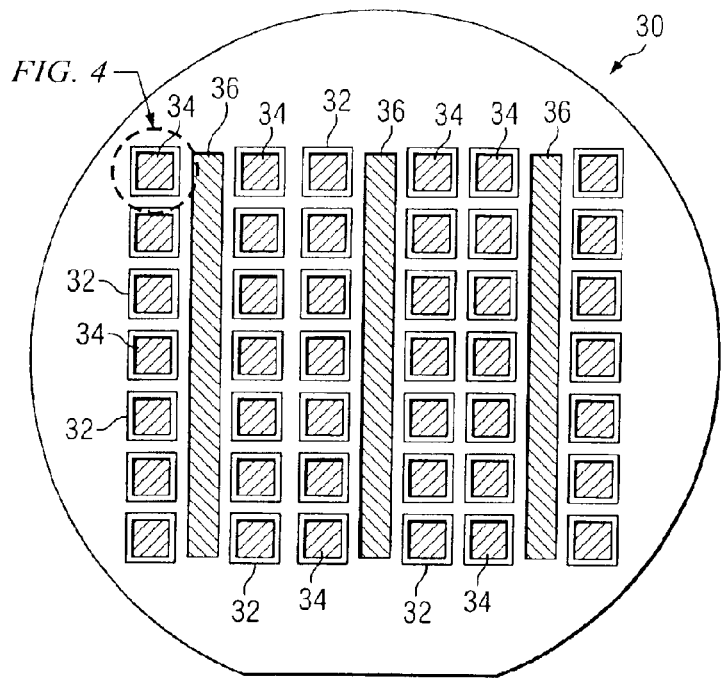
FIG. 3 is a top view of a pattern side of a lid wafer in accordance with an embodiment of the present invention.

FIG. 3 illustrates a silicon lid wafer 30. Although the embodiment described below utilizes a silicon wafer as a substrate for the lid wafer 30, any suitable substrate material may be used. Examples of materials other than silicon which may be used as optically-transparent device wafer lids include quartz or Pyrex, zinc, germanium, sapphire, or infrared chalcogenide glass. Lid wafer 30 includes a plurality of lid sealing surfaces 32, preferably corresponding in number to the device sealing surfaces 16 on device wafer 10. Each of the lid sealing surfaces 32 is preferably a mirror image of a respective device sealing surface 16 so that lid wafer 30 mates with device wafer 10. Cavities 34 and bonding pad channels 36 are etched in the lid wafer 30 using an appropriate etching process such as wet or dry etching. Additionally, trenches 42 may be etched in lid wafer 30. Trenches 42 are preferably disposed in sealing surfaces 32 in order to prevent any sealing material from entering cavities 34. Anisotropic etching using potassium hydroxide (KOH), or any other suitable basic solution may be used to etch cavities 34, bonding pad channels 36, and trenches 42. The etching process for cavities 34, bonding pad channels 36, and trenches 42 may include depositing a layer of silicon nitride and patterning the silicon nitride layer to form an appropriate etch mask.

Figure 4A:
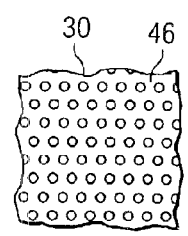
FIG. 4A is an exterior view of a portion of the lid wafer in FIG. 4.
Figure 4:
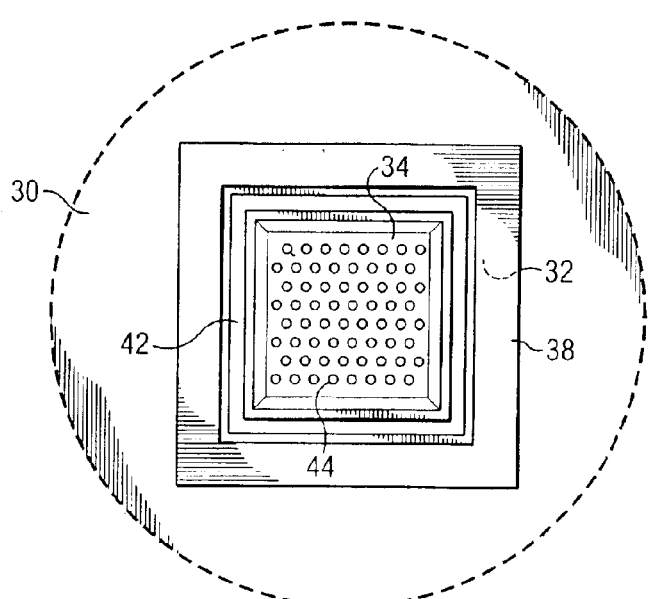
FIG. 4 is an enlarged view of a portion of a lid wafer with a lid cavity in accordance with an embodiment of the present invention.

FIGS. 4 and 4A illustrate an enlarged view of a portion of lid wafer 30 that is preferably operable to form the lid portion of a single vacuum packaged MEMS device. FIG. 4 is a view of the interior of an individual cavity 34 on lid wafer 30. Sealing surface 32, cavity 34, and trench 42 are illustrated in accordance with an embodiment of the present invention. FIG. 4A illustrates a portion of the opposite side of lid wafer 30, which is the exterior surface of lid wafer 30. In addition to sealing surface 32, cavity 34, and trench 42, sub-wavelength structures 44 and 46 are etched on the interior surface and exterior surface, respectively of lid wafer 30. Sub-wavelength structures 44 and 46 may be etched using isotropic wet or dry etching, or by anisotropic etching using potassium hydroxide, or other anisotropic basic solution.

FIG. 5 illustrates a cross-sectional view of the lid wafer section illustrated by FIG. 4. In one embodiment, sub-wavelength structures 44 are preferably etched on the interior surface of lid wafer 30. Additionally, sub-wavelength structures 46 may be etched on the outer surface of lid wafer 30. Etching a pattern on the lid wafer surface changes the index of refraction by reducing the index of refraction in the etched region according to a fill factor. The fill factor may be described as the ratio of the remaining solid material, which in the present embodiment is silicon, over the total affected volume. Optical transmission may also be increased by depositing a fill material 48 with a lower index of refraction than the lid wafer in the spaces between the sub-wavelength structures. Depositing fill material 48 may provide a protective cover on the outer surface of the lid wafer and on the individual sub-wavelength structures themselves, and may further enhance optical transmission properties of the lid wafer. In one embodiment, organic compounds such as polyethylene, polyimide, and polypropylene that have refractive indexes below 1.5 may be used as fill material 48. Additionally, inorganic compounds with indexes of refraction of 1.5 or less may be used as fill material 48. Examples of inorganic compounds for use as fill material 48 are magnesium oxide, magnesium fluoride, and calcium fluoride.

Figure 6:
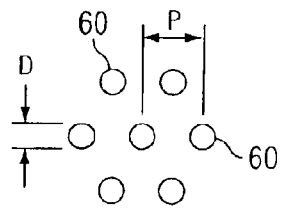
FIG. 6 is an example of a pattern for sub-wavelength structures in accordance with an embodiment of the present invention.
Figure 7:
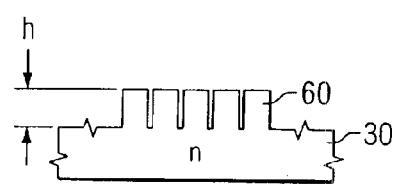
FIG. 7 is a partial cross-sectional view of sub-wavelength structures etched on one surface of a lid wafer in accordance with an embodiment of the present invention.

FIGS. 6 and 7 illustrate embodiments of the sub-wavelength structure disposition on a device wafer lid. Generally, the fill factor (FF) is related inversely to the index of refraction n of the lid material. This relationship may be described by the equation $$FF = \frac{1}{n+1}.$$

Individual sub-wavelength structures 60 have a diameter D and a center-to-center separation P arranged in a hexagonal close-packed pattern on the surface of a silicon wafer with a refractive index n. Center separation P may be determined by the following equation:

$$P = \sqrt{\frac{\pi}{2\sqrt{3}\,(FF)}}\,D.$$

The height h of individual sub-wavelength structure 60 is dependent on the wavelength λ of the incident light and the index of refraction n of the lid material, and may be described by the equation $$h = \frac{\lambda}{4\sqrt{n}}.$$

Therefore, for lid wafers designed to minimize reflection in a light spectrum with a wavelength centered at ten microns, an appropriate sub-wavelength structure will have dimensions on the order of microns. Thus, if the wafer index of refraction n=3.4215 at λ=10 microns incident wavelength, the structure parameters are h=λ/4√n=1.35 microns, fill factor $$FF = \frac{1}{3.4215 + 1} = 0.226,$$

and center-to-center distance $$P = \sqrt{\pi/2\sqrt{3}\,(FF)}\;\; D \text{ or } P = 2.00D.$$

Although the embodiment described above utilizes a hexagonal close-packed pattern, any suitable pattern of sub-wavelength structures 44 and 46 may be arrayed, or etched on a device wafer lid interior surface or exterior surface, respectively, to reduce the index of refraction.

FIG. 8 illustrates an alternative embodiment wherein a window or spacer 80 is used to create an interior surface with sub-wavelength structures 44 etched thereon. Window or spacer 80 may be manufactured from any suitable substrate material, and may be bonded to wafer lid 30 using soft glass, glass solder, an indium compression seal, or any other suitable method for layering substrates. In this embodiment, device sealing surfaces 38, trenches 42, and cavities 34 may be created by using a window or spacer 80 containing apertures which correspond to each MEMS device deposited on device wafer 10.

Although the present invention has been described in detail, it should be understood that various changes, substitutions, and alterations may be made, without departing from the spirit and scope of the present invention as defined by the claims.

What is claimed is:

1. A lid wafer for an integrated circuit device comprising:
a first side;
a second side;
a cavity disposed within the first side;
one or more sub-wavelength structures disposed on the first side, wherein the one or more sub-wavelength structures are smaller in diameter and height than a wavelength of incident light; and
one or more sub-wavelength structures disposed on the second side wherein the one or more sub-wavelength structures are smaller in diameter and height than a wavelength of incident light.

2. The lid wafer of claim 1, wherein the one or more sub-wavelength structures are arrayed in a hexagonal close-packed pattern.

3. The lid wafer of claim 1, wherein the height of each one or more sub-wavelength structure is a function of the index of refraction of the lid wafer.

4. The lid wafer of claim 1, wherein the spacing between respective sub-wavelength structures is a function of the diameter of respective individual one or more sub-wavelength structures and the index of refraction of the lid wafer.

5. The lid wafer of claim 1, further comprising a low index of refraction material deposited between the one or more sub-wavelength structures on the first side.

6. The lid wafer of claim 1, further comprising a low index of refraction material deposited between the one or more sub-wavelength structures on the second side.

7. A lid wafer for an integrated circuit device comprising:
a first side;
a second side;
a cavity disposed within the first side;
one or more sub-wavelength structures disposed within the cavity;
one or more sub-wavelength structures disposed on the second side;
a fill material deposited between the one or more sub-wavelength structures on the first;
a fill material deposited between the one or more sub-wavelength structures on the second side, wherein the one or more sub-wavelength structures are arrayed in a hexagonal close-packed pattern, and wherein the one or more sub-wavelength structures are smaller in diameter and height than the wavelength of any incident light in the infrared spectrum, wherein the height of respective sub-wavelength structures is a function of the index of refraction of the lid wafer, and wherein the spacing between respective sub-wavelength structures is a function of the diameter of each respective sub-wavelength structure and the index of refraction of the lid wafer.

* * * * *